United States Patent [19]
Clark

[11] Patent Number: 5,271,040
[45] Date of Patent: Dec. 14, 1993

[54] PHASE DETECTOR CIRCUIT

[75] Inventor: Lawrence T. Clark, Tempe, Ariz.

[73] Assignee: VLSI Technology, Inc., San Jose, Calif.

[21] Appl. No.: 811,092

[22] Filed: Dec. 20, 1991

[51] Int. Cl.[5] .............................................. H03D 3/18
[52] U.S. Cl. ...................................... 375/81; 375/120; 329/307; 307/511
[58] Field of Search ................... 375/80, 81, 119, 120; 329/307, 305, 360; 328/133, 155; 331/25; 307/510, 511, 514; 455/260

[56] References Cited

U.S. PATENT DOCUMENTS

| | | | |
|---|---|---|---|
| 4,584,695 | 4/1986 | Wong et al. | 375/81 |
| 4,617,679 | 10/1986 | Brooks | 375/120 |
| 4,837,781 | 6/1989 | Hickling | 375/81 |
| 4,972,161 | 11/1990 | Davis et al. | 375/120 |
| 5,003,562 | 3/1991 | Van Drieck et al. | 375/81 |
| 5,097,489 | 3/1992 | Tucci | 375/120 |

OTHER PUBLICATIONS

R. E. Best, Phase-Locked Loops, McGraw-Hill, Inc., New York, 1984, pp. 9-15 and 70-79.

Primary Examiner—Curtis Kuntz
Assistant Examiner—T. Ghebretinsae
Attorney, Agent, or Firm—LaValle D. Ptak

[57] ABSTRACT

A digital phase detector circuit is designed for particular application with a phase-locked loop voltage controlled oscillator system for synchronizing the MFM synchronization pulses on a floppy disk with the operation of the computer in which the disk is used. A classical Type 4 digital phase detector is employed, to which a bistable latch is added. The latch is set upon coincidence of reference and data pulses applied to the phase detector within a pre-established time interval or window. The output of the phase detector then is utilized only when the output of the latch indicates such coincidence; so that erroneous control signals are not supplied through the loop whenever data pulses fail to occur in adjacent time frames or windows.

15 Claims, 2 Drawing Sheets

PHASE DETECTOR CIRCUIT

BACKGROUND

Floppy disks encoded in modified FM (MFM) are in widespread use with personal computers (PC's). It is necessary to synchronize the transfer of information from the disk in the disk drive of the computer with the internal clock of the computer. To accomplish this, a voltage controlled oscillator within the computer, which is used to provide the clock signals, is synchronized in frequency with the frequency of data encoded on the disk. It is possible for variations of as much as plus and minus ten percent to occur between the internal clock frequency of the computer and the synchronization field frequency read from the disk. This may be caused by differences between the speed of operation of the disk drive motor in the computer, where the information originally was stored, and the motor in the drive of the computer with which the disk is to be used.

In the past, synchronization typically has been handled by voltage controlled oscillators in an analog phase-locked loop (PLL). The data from the disk, which is used to synchronize the operation of the voltage controlled oscillator of the computer, frequently has pulses missing in adjacent cycles or comparison windows. To avoid erroneous operation of the PLL phase detector in such a situation, a typical solution has been to use a one-quarter cycle delay line to delay the data; so that a data pulse is known to be present in a given comparison window before the phase detector receives it as input. With this information, the phase detector may be disabled when no data pulse is present in a given comparison window. An alternative is that pulses can be inserted from the reference source to be substituted for the missing data pulses. The delay line, however, is an analog delay line, and whether this delay line is used in conjunction with a pulse inserter or a disabling circuit, additional circuit components are necessary to effect the proper operation of the phase detector.

The use of analog components, however, does have some disadvantages. One of these is that analog circuits are difficult to fabricate with precision and predictability in an integrated circuit. A second disadvantage is that analog components are subject to significant drift with temperature. Consequently, any analog design must allow sufficient margin for such temperature-caused drift.

Digital phase detectors for PLL operation have been developed. Three types of digital phase detector circuits generally are used. The first of these (called Type 2) is an EXCLUSIVE OR gate type of circuit. The second (Type 3) is an edge-triggered JK flip-flop. The third (known as Type 4) is a phase/frequency detector. Type 4 phase discriminators are generally considered superior to both Type 2 and Type 3 phase detectors. Type 4 phase detectors are independent of the duty cycle ratio of the waveforms applied to the inputs, and, additionally, exhibit marked sensitivity to frequency for even the smallest offset of the frequencies between the two inputs. Consequently, Type 4 phase detector circuits are frequently referred to as phase/frequency detectors.

A conventional Type 4 phase detector, however, will fail on any given window or comparison interval when no data pulse appears. When this situation occurs, the charge pump (in an analog PLL) is caused to pump up (or down) erroneously. In a digital PLL, the phase error calculated is incorrect in such a window, and causes the oscillator frequency to be changed incorrectly.

Consequently, there are disadvantages to both analog and digital phase detectors when these detectors are used with a system for synchronization with the data encoded on a floppy disk, since that data, as mentioned above, frequently includes comparison windows where data pulses are missing.

It is desirable to provide a digital phase detection circuit, which overcomes the disadvantages of the prior art mentioned above, and which is simple to implement and operate.

SUMMARY OF THE INVENTION

Accordingly, it is an object of this invention to provide an improved phase detector circuit.

It is another object of this invention to provide an improved digital phase detector circuit.

It is an additional object of this invention to provide an improved digital phase detector circuit particularly suited for use in a PLL system for comparing reference pulses with data pulses obtained from the synchronization field frequency data of an MFM encoded floppy disk.

It is a further object of this invention to provide a digital phase detector circuit which is not subject to erroneous operation in the event data pulses are missing from adjacent windows or comparison time frame intervals.

In accordance with a preferred embodiment of the invention, a phase detector circuit has first and second inputs responsive, respectively, to a source of reference pulses and a source of data pulses. These pulses operate in the detector circuit to produce output signals for use in a PLL system to modify the operation of the voltage controlled oscillator in accordance with the characteristic of the signals. To prevent erroneous operation from taking place, the signals used to control the operation of the oscillator are utilized only when a reference pulse and data pulse both appear within a predetermined time frame or time window. If both pulses do not appear in the same time window, no information for controlling the oscillator is supplied from the phase detector.

BRIEF DESCRIPTION OF THE DRAWINGS

FIG. 5 is a detailed block circuit diagram of a portion of the circuit shown in FIG. 3.

DETAILED DESCRIPTION

Figure 1:
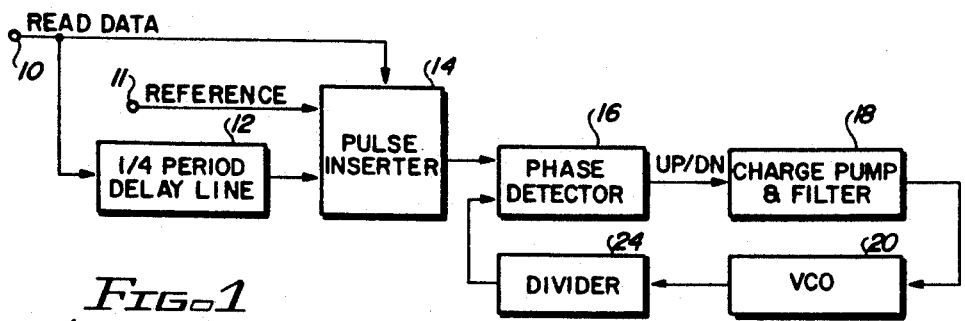
FIG. 1 is a block diagram of a prior art system.

The same reference numbers are used throughout the different figures to designate the same or similar components. FIG. 1 is a block diagram of a prior art analog PLL system used for synchronizing the operation of a voltage controlled oscillator 20 with MFM clock and data pulses or the like.

The pulses to be synchronized in the circuit of FIG. 1 are applied to a read data input terminal 10. To ensure that each of the comparison windows, which are used to operate the phase detector 16, have a data pulse in them, a quarter-cycle or quarter-period delay line 12 is interposed between the read data input terminal 10 and a pulse inserter circuit 14. The undelayed read data pulses also are applied to the pulse inserter circuit 14, as are reference pulses (derived from the voltage controlled oscillator 20) on a terminal 11.

The circuit illustrated in FIG. 1 is a standard analog prior art circuit, and functions to insert reference pulses through the circuit 14 into the incoming data for any cycle or window in which the data pulses are missing. This is done prior to applying the data pulses to the upper one of the two inputs of the phase detector 16. Consequently, each and every window or comparison time period for the phase detector 16 has a data pulse in it. The other input to the phase detector 16 is obtained from the output of the voltage controlled oscillator 20 through a divider circuit 24 to provide pulses at the proper frequency for comparison with the data pulses applied to the terminal 10. The phase detector 16 may be any well known type of phase detector to produce an output signal representative of the up/down control required for the oscillator. This output signal is applied to a standard charge pump and filter 18, which, in turn, produces an output for controlling the frequency of operation of the oscillator 20. As mentioned above, this circuit is subject to the disadvantages inherent in analog circuits.

Figure 2:
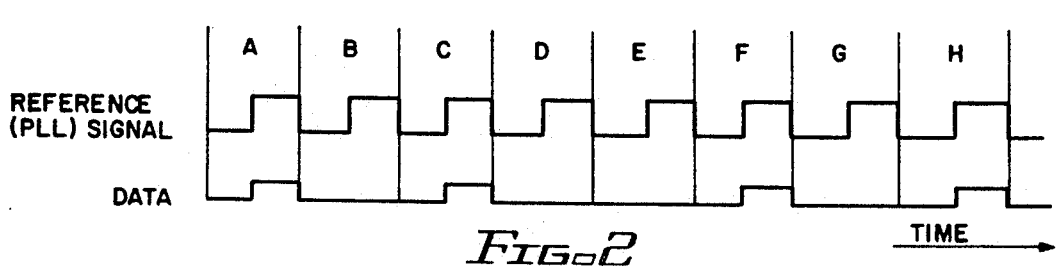
FIG. 2 is a waveform diagram useful in explaining the operation of the circuit shown in FIG. 1, and in subsequent figures.

The waveforms of FIG. 2 illustrate representative reference signals applied to the terminal 11 (the upper one of the two field frequency data stream applied to the terminal 10 (the lower one of the waveforms of FIG. 2). The synchronization time frames or windows for adjacent sets of these pulses are identified in FIG. 2 by the letters A through H, inclusive. Without the use of the pulse inserter circuit 14 of FIG. 1, erroneous information would be supplied from the phase detector 16 to the charge pump and filter 18 in windows B, D, E and G, since no data pulses appear in those comparison windows. In the analog circuit of FIG. 1, the pulse inserter 14 inserts a reference pulse into the upper input of the phase detector 16 in each of these windows.

A similar erroneous output is obtained from a digital Type 4 phase/frequency detector for those same windows. Consequently, a provision must be made to achieve the effect of the pulse inserter circuit 14 of FIG. 1 if a digital phase detector circuit is to be successfully used to synchronize the synchronization field data pulses with the voltage controlled oscillator of the computer.

Figure 3:
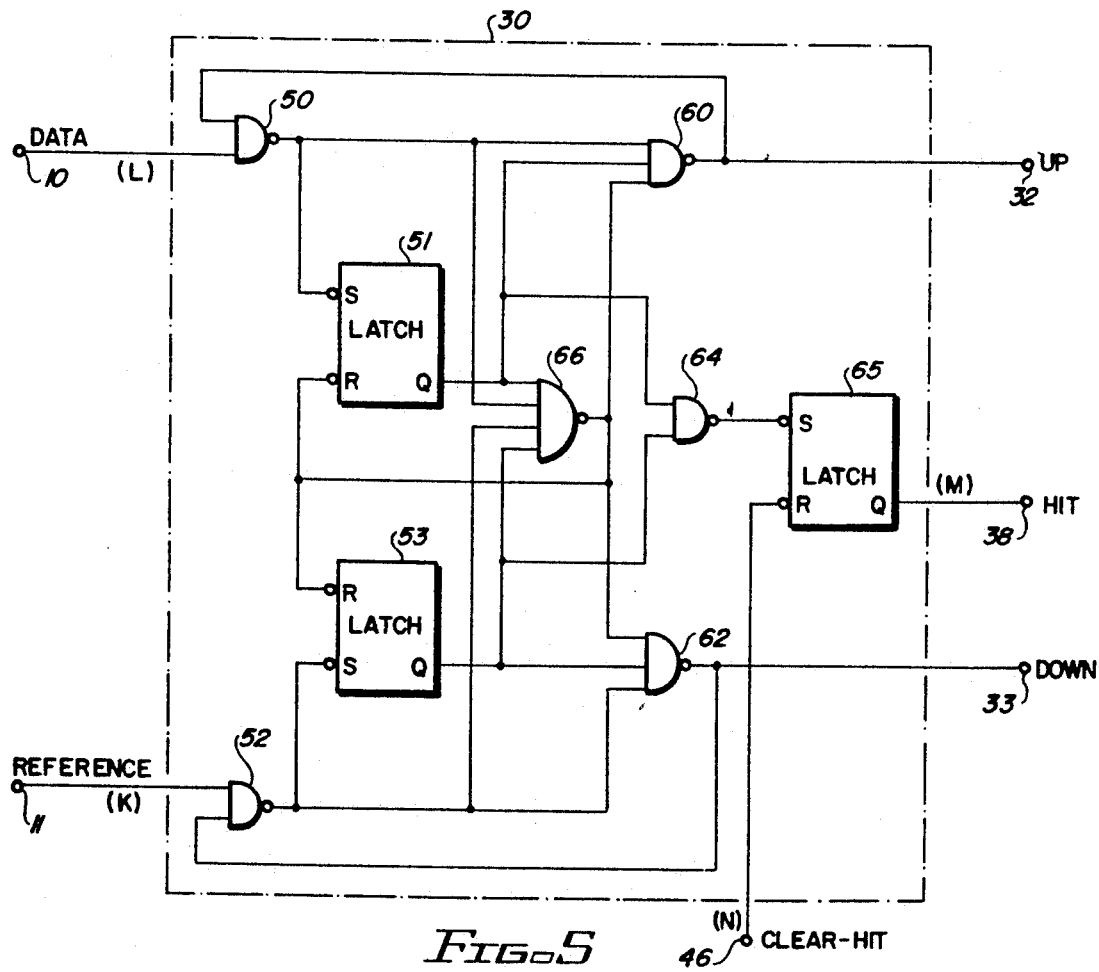
FIG. 3 is a block diagram of a preferred embodiment of the invention.
Figure 3:
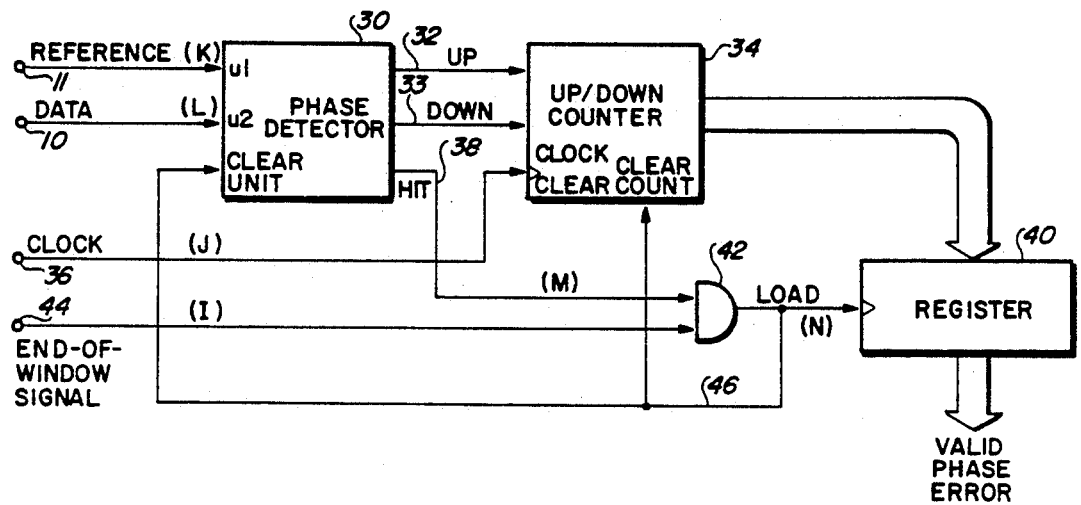

The circuit of FIG. 3 has been designed to provide a digital solution to the problem mentioned above in conjunction with FIGS. 1 and 2. In the circuit of FIG. 3, the data pulses and the reference pulses are applied to the terminals 10 and 11, respectively, to constitute the two inputs to a digital phase detector circuit 30. The phase detector portion of the circuit 30 preferably is a Type 4 phase detector, to which a bistable flip-flop latch has been added. The latch is set each time both a reference pulse and a data pulse appear in a comparison window or a comparison time frame.

As illustrated in FIG. 3, the up and down output signals 32 and 33, from the phase detector 30, are applied to a digital up/down counter 34. The presence of one or the other of the signals on the leads 32 and 33 enable the counter 34 to count in the indicated direction. The actual counting, which is effected by the digital counter 34, is accomplished by means of clock pulses applied to a terminal 36. These clock pulses typically are at a frequency which is greater than the frequency of the reference signals applied to the terminal 11. The clock pulses 36, however, are derived from a digitally controlled oscillator (not shown in FIG. 3), which is controlled by the system of FIG. 3 in a digital PLL loop. The clock signals are not divided down or are not divided down as much as the signals applied to the reference terminal 11.

Instead of applying the output of the counter 34 directly to the PLL filter and control circuit for the voltage controlled oscillator, the output of the counter 34 is applied to a buffer register 40. Consequently, the count in the counter 34 at any given time is transferred to the buffer register 40 only when an enable or a load signal is applied to its "load" input. Such "load" signals are obtained from the output of an AND gate 42, which has two inputs supplied to it. One of these inputs is the "hit" output of the latch in the phase detector 30. This "hit" output signal is applied over a lead 38 and indicates the occurrence, in the same time frame or comparison window, of both a reference pulse and a data pulse. At the end of the time frame window, an end-of-window signal 44 is applied to the other input of the AND gate 42. Thus, if no data pulses are missing in the particular time frame under consideration, a load pulse is applied to the buffer register 40, and the output of the up/down counter 34 is transferred into the register 40. As indicated in FIG. 3, the output of the register 40 then is applied to the remainder of the digitally controlled phase-lock loop (not shown) for controlling the oscillator frequency; and this output does constitute a valid phase error.

The same pulse, which is obtained from the gate 42 to transfer information into the register 40 from the counter 34, also is applied to the counter 34 to set it to a clear or initial count, and to the latch in the phase detector 30 to reset it back to an original condition for the next comparison window.

Figure 4:
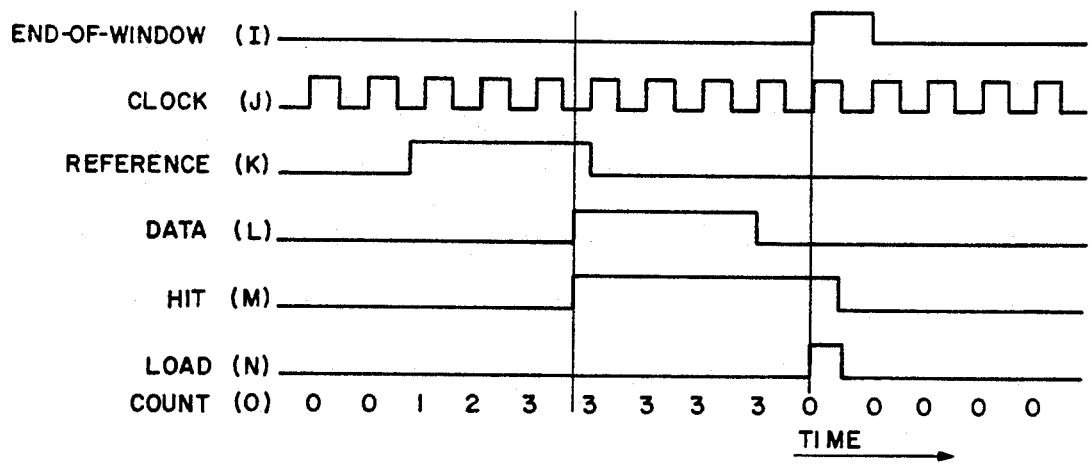
FIG. 4 illustrates waveforms useful in explaining the operation of the circuit of FIG. 3.

FIG. 4 is representative waveform diagram of a single time frame window of operation, showing the waveforms of the signals occurring at different parts of the circuit of FIG. 3. The signals in FIG. 4 are identified with the letters I through N, and these same letter designations are shown adjacent each of the leads on which these signals appear in FIG. 3. The lowermost line (0) in FIG. 4 is representative of the count which is effected by the counter 34 in response to the various signals applied to it. Since the transferred, due to the appearance of a load pulse (N); so that the register 40 stores the count (illustrated as "3") attained by the counter prior to the clearing of the counter or resetting of the counter by the pulse (N), which is applied over the lead 46, to reset the counter.

FIG. 5 is a detailed schematic diagram of a typical digital Type 4 phase detector, to which the latch circuit described above in conjunction with FIG. 3 has been added. The inputs and outputs of the circuit of FIG. 4, which correspond to those in FIG. 3, are identified with the same reference numbers; and the same letters, which correlate these inputs and outputs with the waveform of FIG. 4, also are used in FIG. 5.

The phase detector of FIG. 5 includes two S/R latches 51 and 53, which respond, respectively, to the data signals on the terminal 10 and the reference signals on the terminal 11 (by way of NAND gates 50 and 52, respectively).

A third S/R latch 65 has been added, and it constitutes the coincidence latch circuit, which produces the "hit" signals on the terminal 38 of FIG. 3. At the start, all of the latches 51, 53 and 65 are in their reset state of operation; so that the "Q" outputs of these latches both are "low" or a binary "0". In this state of operation, prior to the receipt of any signals on the terminals 10 and 11, all of the NAND gates 50, 52, 60, 62 and 66 have a "high" output, since at least one of the inputs to each one of these gates is a "low" input. This is readily ascertained from an examination of the circuit of FIG. 5. At the same time, the NAND gate 64, which is connected to the "Q" outputs of each of the latches 51 and 53, is high, since the outputs of both of these latches are low at this time. This, therefore, primes the latch 65 to receive a negative-going trigger pulse from the NAND gate 64. Similarly, the latches 51 and 53 both are primed on their set (s) inputs with a steady state high signal; so that these latches will respond to negative-going trigger pulses whenever the outputs from the gates 50 and 52, respectively, change from "high" output to "low".

Assume, for the purposes of the present illustration, that the window which is illustrated in the waveforms of FIG. 4 is present, and constitutes the signal pattern which is applied to the phase detector 30 of FIG. 5. As is apparent from an examination of FIG. 4, a reference pulse (K) in the form of a positive-going pulse is applied to the upper terminal of the NAND gate 52. Since the other input to the NAND gate 52 also is high at this time, its output drops low to trigger the latch 53 into its "set" state of operation. This causes the output of the latch 53 to go high, thereby priming the gates 62, 66 and 64. At the end of the positive portion of the reference pulse on terminal 11, the output of the gate 52 once again goes high. The status of the latch 53 is unchanged at this time; but the NAND gate 62 provides a "low" signal on its output, which is applied to the "down" terminal 33 connected to the counter 34 (FIG. 3).

In the example under consideration, just prior to the end of the reference pulse (K) of FIG. 4, the data pulse (L) is applied to the terminal 10. This pulse has the same effect on the latch 51, and applies a trigger or a set pulse to the latch 51, causing its output to go "high".

When the outputs of both of the latches 51 and 53 go high, because these latches were set during the window interval under consideration, the two inputs to the NAND gate 64 coincide, and cause a negative-going trigger pulse to be applied to the latch 65 to set the latch 65 to its "high" state. This is the "hit" pulse (M) shown in FIG. 4. As soon as both the data and reference pulses go back to the zero states (when these pulses terminate), both of the other two inputs to the NAND gate 66 go high, causing it to produce a negative reset trigger pulse at its output. When this pulse occurs, both of the latches 51 and 53 are reset back to their initial state of operation, and the original conditions are established, with the exception of the latch flip-flop 65.

The flip-flop 65 is reset to its initial or "low" condition of operation upon the occurrence of the end-of-window signal 44 applied to the AND gate 42 (described earlier in conjunction with FIG. 3). Once this occurs, the entire circuit is re-established in its condition of operation for the next window or time frame for comparison.

If there is no overlap within the comparison window, the flip-flop 65 is not set (since the gate 64 only produces a set input when both of the flip-flops 51 and 53 are set during a comparison window or time interval).

Consequently, there is no output on the hit terminal 38, and no transfer of data into the register 40 takes place for such a time interval. With the exception of the NAND gate 64 and the latch 65, the phase detector 30 of FIG. 5 is a standard Type 4 digital phase detector. The components 64 and 65, however permit the use of this phase detector for a situation of the type illustrated in FIG. 2 to prevent erroneous transfer of data from the up/down counter 34 to the controlled oscillator (not shown in FIGS. 3 and 5) from the register 40. The addition of the circuit components shown in FIGS. 3 and 5 to the standard Type 4 phase detector provide an effective manner of locking in the phase of the voltage controlled oscillator of the system with which these circuits are used, for situations where data pulses do not sequentially occur in every timing interval or timing window.

The foregoing description of the preferred embodiment of the invention should be considered as illustrative, and not as limiting. Various changes and modifications will occur to those skilled in the art, without departing from the true scope of the invention as defined in the appended claims.

I claim:

1. A phase detector circuit for use in a digital phase-locked loop system including in combination:

a source of reference pulses;

a source of data pulses;

phase detector means with first and second inputs coupled, respectively, to said source of reference pulses and said source of data pulses, and responsive to differences in phase between the pulses coupled to said first and second inputs for producing output signals on respective first and second outputs when the reference pulses lead and lag the data pulses, in accordance with such phase differences;

latch means coupled with said phase detector means for providing a predetermined output signal on an output thereof in response to the occurrence of a reference pulse and a data pulse applied to the first and second inputs of said phase detector means within a predetermined time frame window;

utilization means coupled with the outputs of said phase detector means and said latch means, and enabled by the output from said latch means for responding to signals appearing on the first and second outputs of said phase detector means only when said latch means provides said predetermined output signal on the output thereof; and a source of time frame end of window pulses spaced to establish said predetermined time frame window for resetting said latch means to an initial operating condition, removing said predetermined output signal from the output thereof.

2. The combination according to claim 1 wherein said phase detector means comprises a Type 4 digital phase detector.

3. The combination according to claim 2 wherein said latch means comprises a bistable set/reset latch.

4. The combination according to claim 3 wherein said phase detector circuit is used for synchronization of modified FM (MFM) encoded data obtained from a computer floppy disk, and wherein said source of data pulses comprises pulses from the data encoded on such floppy disk.

5. The combination according to claim 1 wherein said latch means comprises a bistable set/reset latch.

6. The combination according to claim 2 wherein said phase detector circuit is used for synchronization of modified FM (MFM) encoded data obtained from a computer floppy disk, and wherein said source of data pulses comprises pulses of data encoded on such floppy disk.

7. A phase detector circuit for use in a digital phase-locked loop system including in combination:

a source of reference pulses;

a source of data pulses;

phase detector means with first and second inputs coupled, respectively, to said source of reference pulses and said source of data pulses, and responsive to differences in phase between the pulses coupled to said first and second inputs for producing output signals on respective "up" and "down" outputs when the reference pulses lag and lead the data pulses, in accordance with such phase differences;

up-down counter means coupled with the up and down outputs of said phase detector means for increasing and decreasing the count thereof in accordance with the output signals of said phase detector means;

latch means coupled with said phase detector means for providing a predetermined output signal on an output thereof in response to the occurrence of a reference pulse and a data pulse applied to the first and second inputs of said phase detector means within a predetermined time frame window;

a source of time frame end of window pulses for establishing said predetermined time frame window;

coincidence gate means with inputs coupled with the output of said latch means and said source of time frame end of window pulses for producing an output enable signal on an output therefrom in response to coincidence of said predetermined output signal from said latch means and a time frame end of window pulse;

utilization means coupled with said counter means for responding to the count therein, said utilization means further coupled with the output of said coincidence gate means for utilizing the count in said counter means in response to said enable output signal from said coincidence gate means; and means for coupling the output of said coincidence gate means with said latch means for resetting said latch means to an initial condition of operation upon the occurrence of an enable signal from said gate means.

8. The combination according to claim 7 wherein said phase detector means comprises a type 4 digital phase detector.

9. The combination according to claim 8 further including clock means coupled with said up-down counter means to advance and decrease the count therein in accordance with the output signals applied thereto from said phase detector means.

10. The combination according to claim 9 wherein said utilization means comprises a buffer storage register for storing the output of said counter means each time an enable output signal from said coincidence gate means is applied to said buffer storage register.

11. The combination according to claim 10 wherein the enable output signal of said coincidence gate means is applied to said counter means to reset said counter means to an initial count.

12. The combination according to claim 11 wherein said phase detector circuit is used for synchronization of modified FM (MFM) encoded data obtained from a computer floppy disk, and wherein said source of data pulses comprises pulses of data encoded on such floppy disk.

13. The combination according to claim 7 wherein said utilization means comprises a buffer storage register for storing the output of said counter means each time an enable output signal from said coincidence gate means is applied to said buffer storage register.

14. The combination according to claim 13 further including clock means coupled with said up-down counter means to advance and decrease the count therein in accordance with the output signals applied thereto from said phase detector means.

15. The combination according to claim 7 wherein said phase detector circuit is used for synchronization of modified FM (MFM) encoded data obtained from a computer floppy disk, and wherein said source of data pulses comprises synchronizing pulses from the synchronizing field of data encoded on such floppy disk.

* * * * *